(12) United States Patent
Myong

(10) Patent No.: US 8,426,240 B2
(45) Date of Patent: Apr. 23, 2013

(54) METHOD FOR MANUFACTURING PHOTOVOLTAIC DEVICE INCLUDING FLEXIBLE OR INFLEXIBLE SUBSTRATE

(75) Inventor: Seung-Yeop Myong, Seoul (KR)

(73) Assignee: Kisco (KR)

( * ) Notice: Subject to any disclaimer, the term of this patent is extended or adjusted under 35 U.S.C. 154(b) by 231 days.

(21) Appl. No.: 13/080,272

(22) Filed: Apr. 5, 2011

(65) Prior Publication Data
US 2011/0244618 A1    Oct. 6, 2011

(30) Foreign Application Priority Data
Apr. 5, 2010   (KR) .................. 10-2010-0030837

(51) Int. Cl.
*H01L 31/0232* (2006.01)
*H01L 21/0232* (2006.01)

(52) U.S. Cl.
USPC ......... 438/72; 438/69; 136/255; 257/E31.127

(58) Field of Classification Search ................. 438/69, 438/72, 763; 136/255
See application file for complete search history.

(56) References Cited

U.S. PATENT DOCUMENTS

| | | | | |
|---|---|---|---|---|
| 2002/0053217 A1* | 5/2002 | Chua et al. | ...................... | 62/480 |
| 2002/0098713 A1* | 7/2002 | Henley et al. | .................. | 438/776 |
| 2011/0061716 A1* | 3/2011 | Myong | .......................... | 136/246 |
| 2011/0158822 A1* | 6/2011 | Bartels | ............................ | 417/53 |
| 2011/0232753 A1* | 9/2011 | Sheng et al. | .................. | 136/258 |
| 2012/0015473 A1* | 1/2012 | Uchida et al. | ................... | 438/87 |
| 2012/0067409 A1* | 3/2012 | Myong | .......................... | 136/255 |
| 2012/0080081 A1* | 4/2012 | Klein et al. | .................... | 136/255 |

* cited by examiner

*Primary Examiner* — Alexander Ghyka
(74) *Attorney, Agent, or Firm* — The Belles Group, P.C.

(57) ABSTRACT

Disclosed is a method for manufacturing a photovoltaic device including: a forming the first sub-layer including impurity by allowing first flow rate values of the source gas introduced into one group of a first group consisting of odd numbered process chambers and a second group consisting of even numbered process chambers to be maintained constant in each of the process chambers of the one group; and a forming the second sub-layer including impurity by allowing second flow rate values of the source gas introduced into the other group of the first group and the second group to be maintained constant in each of the process chambers of the other group, wherein the second flow rate values are less than the first flow rate values.

20 Claims, 5 Drawing Sheets

METHOD FOR MANUFACTURING PHOTOVOLTAIC DEVICE INCLUDING FLEXIBLE OR INFLEXIBLE SUBSTRATE

CROSS-REFERENCE TO RELATED APPLICATIONS

This application claims priority under 35 U.S.C. §119 to Korean Patent Application No. 10-2010-0030837 filed on Apr. 5, 2010, the entirety of which is hereby incorporated by reference.

FIELD OF THE INVENTION

The present invention relates to a method for manufacturing a photovoltaic device including a flexible substrate or an inflexible substrate.

BACKGROUND OF THE INVENTION

Recently, because of a high oil price and a global warming phenomenon based on a large amount $CO_2$ emission, energy is becoming the most important issue in determining the future life of mankind. Even though many renewable energy technologies including, wind force, bio-fuels, a hydrogen/fuel cell and the like have been developed, a photovoltaic device using sunlight is in the spotlight in that solar energy, the origin of all energies, is an almost infinite clean energy source.

The sunlight incident on the surface of the earth has an electric power of 120,000 TW. Thus, theoretically, if a photovoltaic device having a photoelectric conversion efficiency of 10% covers only 0.16% of the land surface of the earth, it is possible to generate electric power of 20 TW that is twice as much as the amount of energy globally consumed during one year.

Actually, the world photovoltaic market has explosively grown by almost 40% of an annual growth rate for the last ten years. Now, a bulk-type silicon photovoltaic device occupies a 90% of the photovoltaic device market share. The bulk-type silicon photovoltaic device includes a single-crystalline silicon photovoltaic device and a multi-crystalline or a poly-crystalline silicon photovoltaic device and the like. However, productivity of a solar-grade silicon wafer which is the main material of the photovoltaic device is not able to fill the explosive demand thereof, so the solar-grade silicon wafer is globally in short supply. Therefore, this shortage of the solar-grade silicon wafer is a huge threatening factor in reducing the manufacturing cost of a photovoltaic device.

Contrary to this, a thin-film silicon photovoltaic device based on a hydrogenated amorphous silicon (a-Si:H) allows to reduce a thickness of a silicon layer equal to or less than $\frac{1}{100}$ as large as that of a silicon wafer of the bulk-type silicon photovoltaic device. Also, it makes possible to manufacture a large area photovoltaic device at a lower cost.

Meanwhile, a single junction thin-film silicon photovoltaic device is limited in its achievable performance. Accordingly, a double junction thin-film silicon photovoltaic device or triple junction thin-film silicon photovoltaic device having a plurality of stacked unit cells has been developed, pursuing high stabilized efficiency.

The double junction or triple junction thin-film silicon photovoltaic device is referred to as a tandem-type photovoltaic device. The open circuit voltage of the tandem-type photovoltaic device corresponds to a sum of each unit cell's open circuit voltage. Short circuit current is determined by a minimum value among the short circuit currents of the unit cells.

Regarding the tandem-type photovoltaic device, research is being devoted to an intermediate reflector which is capable of improving efficiency by enhancing internal reflection between the unit cells.

SUMMARY OF THE INVENTION

One aspect of the present invention is a method for manufacturing a photovoltaic device by forming an intermediate reflector including a first sub-layer and a second sub-layer through the introduction of source gas including non-silicon element into a plurality of process chambers. The method includes: a forming the first sub-layer including impurity by allowing first flow rate values of the source gas introduced into one group of a first group consisting of odd numbered process chambers and a second group consisting of even numbered process chambers to be maintained constant in each of the process chambers of the one group; and a forming the second sub-layer including impurity by allowing second flow rate values of the source gas introduced into the other group of the first group and the second group to be maintained constant in each of the process chambers of the other group, wherein the second flow rate values are less than the first flow rate values.

Another aspect of the present invention is a method for manufacturing a photovoltaic device by forming an intermediate reflector including a first sub-layer and a second sub-layer through the introduction of source gas including non-silicon element into a plurality of process chambers. The method includes: a forming the first sub-layer including impurity by supplying voltage with a first frequency to one group of a first group consisting of odd numbered process chambers and a second group consisting of even numbered process chambers; and a forming the second sub-layer including impurity by supplying voltage with a second frequency greater than the first frequency to the other group of the first group and the second group.

DETAILED DESCRIPTION

A method for manufacturing a photovoltaic device according to an embodiment of the present invention will be described with reference to the drawings.

Figure 1A:
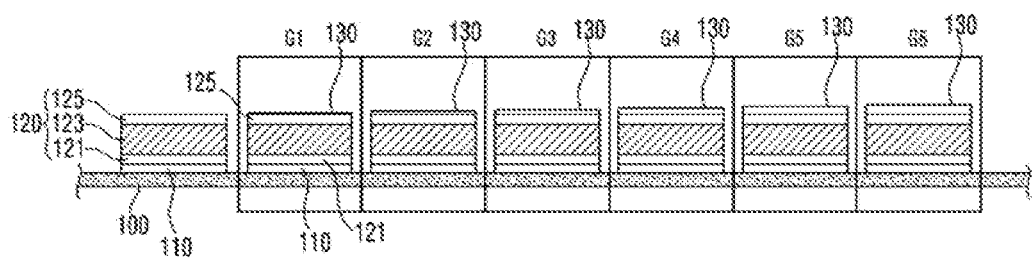
FIGS. 1a and 1b show a method for manufacturing a photovoltaic device according to an embodiment of the present invention.
Figure 1B:
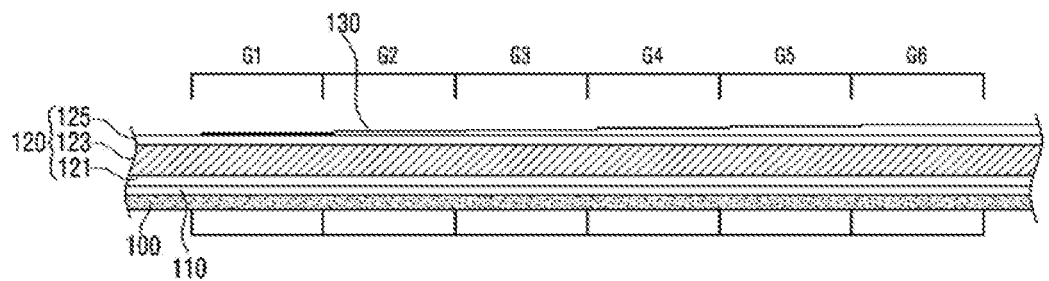

The photovoltaic device may have a double junction structure and a triple junction structure and the like. In FIGS. 1a and 1b, a photovoltaic device having a double junction structure will be described as the example thereof.

FIGS. 1a and 1b show a system for manufacturing a photovoltaic device according to an embodiment of the present invention. FIG. 1a shows a stepping roll type manufacturing system. FIG. 1b shows a roll to roll type manufacturing system. The stepping roll type manufacturing system or the roll to roll type manufacturing system is used to manufacture the photovoltaic device on a flexible substrate such as a metal foil or a polymer substrate.

The manufacturing method for the photovoltaic device according to the embodiment of the present invention can be applied to not only the manufacturing systems shown in FIGS. 1a and 1b but various manufacturing systems, for example, a cluster type manufacturing system used to form a photovoltaic device on an inflexible substrate.

As shown in FIGS. 1a and 1b, provided is a substrate 100 on which a first electrode 110 and a first unit cell 120 have been formed. The first unit cell 120 includes a first conductive semiconductor layer 121, an intrinsic semiconductor layer 123 and a second conductive semiconductor layer 125, all of which are sequentially stacked on the first electrode 110.

When the first conductive semiconductor layer 121 and the second conductive semiconductor layer 125 correspond to a p-type semiconductor layer and an n-type semiconductor layer respectively, the first conductive semiconductor layer 121 and the second conductive semiconductor layer 125 include group Ill impurity and group V impurity respectively. When the first conductive semiconductor layer 121 and the second conductive semiconductor layer 125 correspond to an n-type semiconductor layer and a p-type semiconductor layer respectively, the first conductive semiconductor layer 121 and the second conductive semiconductor layer 125 include group V impurity and group III impurity respectively.

A first conductive semiconductor layer 141 and a second conductive semiconductor layer 145 of a second unit cell 140 can include the aforementioned impurities as well.

Figure 8:
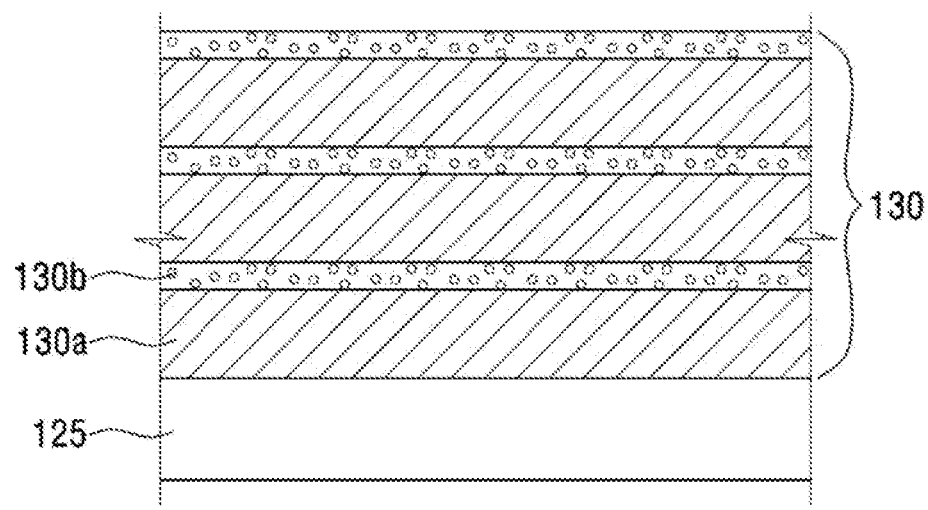
FIG. 8 shows a first sub-layer and a second sub-layer of the intermediate reflector formed according to the embodiment of the present invention.

As shown in FIG. 8, an intermediate reflector 130 including a first sub-layer 130a and a second sub-layer 130b is formed on the first unit cell 120 by introducing source gas including non-silicon element into a plurality of process chambers G1 to G6. The source gas including non-silicon element is introduced into the plurality of the process chambers G1 to G6 in order to form the intermediate reflector 130. Refractive index matching of the intermediate reflector 130 can be accomplished by introducing the non-silicon element. The manufacturing system of the embodiment of the present invention includes a first group consisting of odd numbered process chambers G1, G3 and G5 or a second group consisting of even numbered process chambers G2, G4 and G6.

First flow rate values of the source gas including non-silicon element, which is introduced into one of the first and the second groups, are maintained constant in each process chamber of the one group, and then the first sub-layer 130a is formed. Second flow rate values of the source gas introduced into the other of the first and the second groups are less than the first flow rate values and are maintained constant in each process chamber of the other group, and then the second sub-layer 130b is formed. Here, the first sub-layer 130a and the second sub-layer 130b include impurity so as to improve vertical electrical conductivity.

As such, when the first sub-layer 130a and the second sub-layer 130b are formed according to the flow rate of the source gas including non-silicon element, process conditions (a flow rate of hydrogen, a flow rate of silane, a flow rate of impurity, temperature, pressure) within the process chambers G1 to G6 of the first and the second groups can be maintained constant for a time during which the first sub-layer 130a or the second sub-layer 130b is formed.

The non-silicon element contained in the first sub-layer 130a and the second sub-layer 130b of the intermediate reflector 130 prevents crystallization. Therefore, when the first flow rate value and the second flow rate value are different from each other, a crystal volume fraction of the first sub-layer 130a is different from that of the second sub-layer 130b. Since the crystal volume fraction affects the refractive index of the thin film, the refractive index of the intermediate reflector 130 can be controlled according to a difference between the first flow rate value and the second flow rate value.

Here, the intermediate reflector 130 may include a hydrogenated nano-crystalline silicon based material for the purpose of the improvement of the vertical electrical conductivity. In the embodiment of the present invention, the hydrogenated nano-crystalline silicon based material may include a hydrogenated nano-crystalline silicon oxide (nc-SiO:H), a hydrogenated nano-crystalline silicon carbide (nc-SiC:H) and a hydrogenated nano-crystalline silicon nitride (nc-SiN:H).

The intermediate reflector 130 contacts with an n-type semiconductor layer of one unit cell out of the first unit cell 120 and the second unit cell 140, which receives light prior to the other unit cell. Therefore, when the first sub-layer 130a and the second sub-layer 130b of the intermediate reflector 130 include group V impurity, the intermediate reflector 130 includes an n-type hydrogenated nano-crystalline silicon based material and the vertical electrical conductivity of the intermediate reflector 130 can be more improved.

Since the intermediate reflector 130 includes the n-type hydrogenated nano-crystalline silicon based material, group V impurity may be introduced into the process chambers G1 to G6 at the time of forming the intermediate reflector 130.

Though the manufacturing systems of FIGS. 1a and 1b include six process chambers G1 to G6 for forming the intermediate reflector 130, the number of the process chambers may be less or greater than this.

The intermediate reflector 130 will be described in more detail later.

Figure 2:
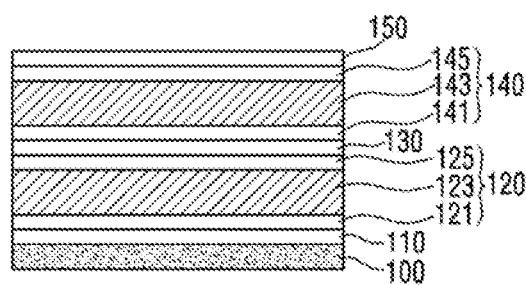
FIG. 2 shows a photovoltaic device according to an embodiment of the present invention.

After the intermediate reflector 130 is formed, the second unit cell 140 and a second electrode 150 are sequentially formed on the intermediate reflector 130. As a result, the photovoltaic device according to the embodiment of the present invention is manufactured as shown in FIG. 2.

The second unit cell 140 includes a first conductive semiconductor layer 141, an intrinsic semiconductor layer 143 and a second conductive semiconductor layer 145.

When the embodiment of the present invention uses a p-i-n type photovoltaic device, the first unit cell 120 receives light prior to the second unit cell 140. Here, the first conductive semiconductor layers 121 and 141 of the first unit cell 120 and the second unit cell 140 are p-type semiconductor layers. The intrinsic semiconductor layers 123 and 143 of the first unit cell 120 and the second unit cell 140 are intrinsic semiconductor layers. And the second conductive semiconductor layers 125 and 145 of the first unit cell 120 and the second unit cell 140 are n-type semiconductor layers.

When the embodiment of the present invention uses an n-i-p type photovoltaic device, the second unit cell 140 receives light prior to the first unit cell 120. Here, the first conductive semiconductor layers 121 and 141 of the first unit cell 120 and the second unit cell 140 are n-type semiconductor layers. The intrinsic semiconductor layers 123 and 143 of the first unit cell 120 and the second unit cell 140 are intrinsic semiconductor layers. And the second conductive semiconductor layers 125 and 145 of the first unit cell 120 and the second unit cell 140 are p-type semiconductor layers.

Here, when either the second conductive semiconductor layer 125 of the first unit cell 120 which receives light prior to the second unit cell 140 or the first conductive semiconductor layer 141 of the second unit cell 140 which receives light prior to the first unit cell 120 is composed of an n-type nano-crystalline silicon, the thickness of the n-type nano-crystalline silicon is equal to or larger than 5 nm and equal to or less than 30 nm. The thickness of the n-type nano-crystalline silicon of either the first unit cell 120 or the second unit cell 140 should be equal to or larger than 5 nm in order to enable the n-type nano-crystalline silicon to perform its function. When the thickness of the n-type nano-crystalline silicon is equal to or less than 30 nm, it is possible to prevent light from being excessively absorbed by the n-type nano-crystalline silicon due to the thickness increase of the n-type nano-crystalline silicon.

Next, a method for manufacturing the intermediate reflector 130 will be described in detail with reference to the drawings.

Figure 3:
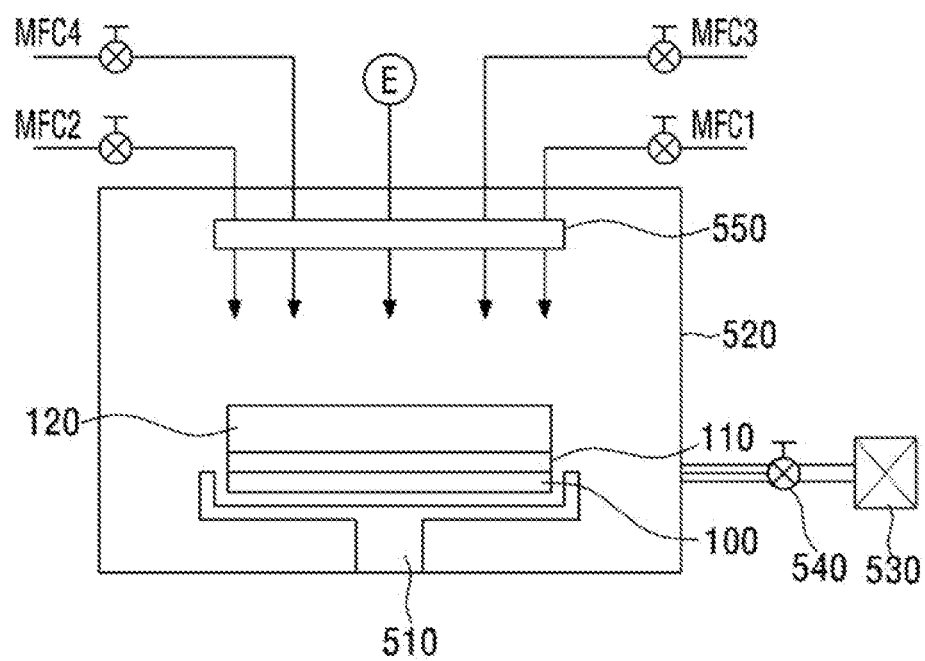
FIG. 3 shows a plasma-enhanced chemical vapor deposition apparatus for forming an intermediate reflector in accordance with an embodiment of the present invention.

FIG. 3 shows an example of a plasma-enhanced chemical vapor deposition apparatus for forming an intermediate reflector in accordance with the embodiment of the present invention. While the manufacturing systems shown in FIGS. 1a and 1b include the plurality of the process chambers G1 to G6, FIG. 3 shows only one process chamber for the convenience of description.

As shown in FIG. 3, the substrate 100 on which the first electrode 110 and the first unit cell 120 have been formed is placed on a plate 510 functioning as an electrode. The first unit cell 120 includes the first conductive semiconductor layer 121, the intrinsic semiconductor layer 123 and the second conductive semiconductor layer 125, all of which are sequentially stacked.

Here, when the second conductive semiconductor layer 125 includes an n-type hydrogenated nano-crystalline silicon (n-nc-Si:H), silane gas ($SiH_4$), hydrogen gas ($H_2$) and phosphine gas ($PH_3$) may be introduced into the process chamber. When the second conductive semiconductor layer 125 includes a p-type hydrogenated nano-crystalline silicon (p-nc-Si:H), silane gas ($SiH_4$), hydrogen gas ($H_2$) and diborane gas ($B_2H_6$) may be introduced into the process chamber.

After the second conductive semiconductor layer 125 including the hydrogenated nano-crystalline silicon is formed, the flow rates of the silane gas, hydrogen gas and impurity gas which are introduced into the process chamber, the substrate temperature and process pressure, etc., of the process chamber are maintained. Then, source gas including non-silicon element is introduced into the process chamber.

As shown in FIG. 3, the hydrogen gas, silane gas and impurity gas are introduced into the process chamber through mass flow controllers MFC1, MFC2 and MFC3 and an electrode 550 having nozzles formed therein. The source gas including non-silicon element is introduced into the process chamber through a mass flow controller MFC4 and the nozzle of the electrode 550.

When the non-silicon element is oxygen, the gas including non-silicon element may include $O_2$ or $CO_2$. When the non-silicon element is carbon, the gas including non-silicon element may include $CH_4$, $C_2H_4$ or $C_2H_2$. When the non-silicon element is nitrogen, the gas including non-silicon element may include $NH_4$, $N_2O$ or $NO$.

Here, an angle valve 540 is controlled to maintain the pressure of the process chamber constant. A pump 530 provides a suction force for exhausting the gases. That is, when the flow rates of the gases introduced through the mass flow controllers MFC1, MFC2 and MFC3 are equal to the flow rates of the gases flowing out through the angle valve 540, the pressure of the process chamber can be maintained constant. When the pressure of the process chamber can be maintained constant, it is prevented that silicon powder is generated by occurrence of turbulence within the process chamber. The hydrogen gas is introduced to dilute the silane gas and reduces Staebler-Wronski effect.

When the said gases and the gas including the non-silicon element are introduced and a power source E supplies voltage, an electric potential difference is generated between the electrode 550 and the plate 510. Accordingly, the gases within the process chamber 520 enter a plasma state, so that a portion of the intermediate reflector 130 is formed on the hydrogenated nano-crystalline silicon of the first unit cell 120.

When gas including oxygen, carbon or nitrogen is introduced, the intermediate reflector 130 includes a hydrogenated nano-crystalline silicon oxide (nc-SiO:H), a hydrogenated nano-crystalline silicon carbide (nc-SiC:H) or a hydrogenated nano-crystalline silicon nitride (nc-SiN:H).

As such, the intermediate reflector 130 includes the hydrogenated nano-crystalline silicon based material similar to the hydrogenated nano-crystalline silicon of a unit cell on which light is incident. Therefore, the intermediate reflector 130 is easily joined to the unit cell on which light is incident.

In the embodiment of the present invention, the source gas including non-silicon element (hereinafter, referred to as source gas) is introduced into the process chamber in accordance with flow rate changes shown in FIGS. 4 to 5.

Figure 4:
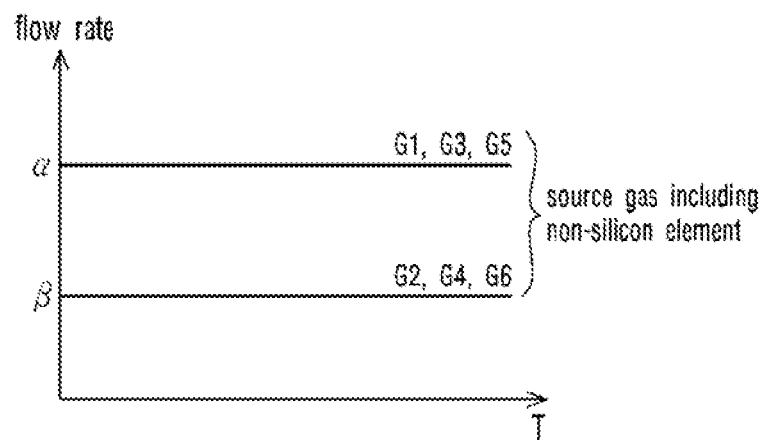
FIGS. 4 to 6 show a flow rate change of gas including non-silicon element in accordance with the embodiment of the present invention.

As shown in FIG. 4, the source gas with first flow rate values $\alpha$ is introduced into one of a first group consisting of odd numbered process chambers G1, G3 and G5 and a second group consisting of even numbered process chambers G2, G4 and G6. Here, the first flow rate values $\alpha$ of the source gas are maintained constant in accordance with the elapsed deposition time T. The source gas with second flow rate values $\beta$ is introduced into the other of the first group consisting of odd numbered process chambers G1, G3 and G5 and the second group consisting of even numbered process chambers G2, G4 and G6. Here, the second flow rate values $\beta$ of the source gas are maintained constant in accordance with the elapsed deposition time T as well. The second flow rate values $\beta$ are less than the first flow rate values $\alpha$. Here, the second flow rate values $\beta$ may be 0.

As described above, since the non-silicon element such as oxygen, carbon or nitrogen prevents crystallization, sub-layers having mutually different crystal volume fractions are formed in the first and the second groups into which the source gas with the first flow rate values $\alpha$ and the second flow rate values $\beta$ has been introduced. That is, the crystal volume fraction of the sub-layer formed in the process chambers into which the source gas with the first flow rate values $\alpha$ has been introduced is less than the crystal volume fraction of the sub-layer formed in the process chambers into which the source gas with the second flow rate values $\beta$ has been introduced.

Hereinafter, the sub-layer formed by introducing the source gas with the first flow rate values $\alpha$ is referred to as a first sub-layer. The sub-layer formed by introducing the source gas with the second flow rate values $\beta$ less than the first flow rate values $\alpha$ is referred to as a second sub-layer.

For example, when the source gas with the first flow rate values $\alpha$ is introduced into the first group, the first sub-layer of the intermediate reflector 130 is formed in the process chambers G1, G3 and G5 of the first group. The source gas with the second flow rate values $\beta$ is introduced into the process chambers G2, G4 and G6 of the second group, so that the second sub-layer is formed, which has a crystal volume fraction greater than that of the first sub-layer.

Figure 5:
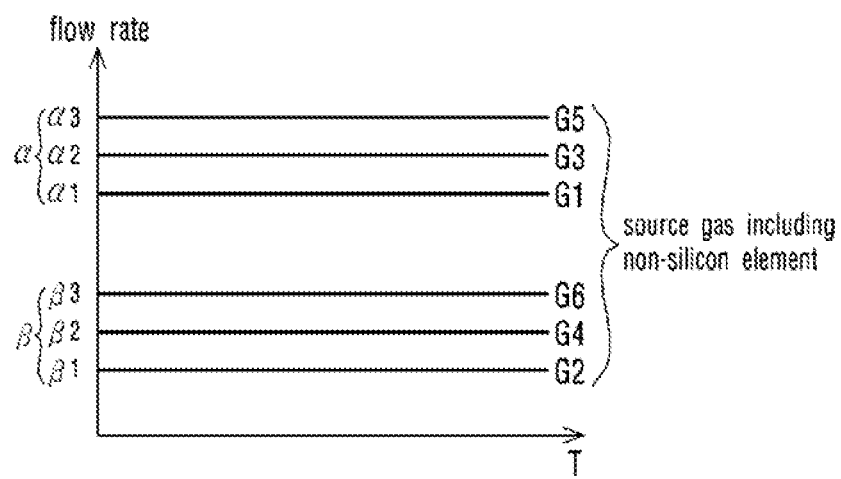

Unlike the flow rate change of FIG. 4, as shown in FIG. 5, the first flow rate value α and the second flow rate value β may increase as the substrate 100 is transferred. That is, the first flow rate values α1, α2 and α3 and the second flow rate values β1, β2 and β3 of the source gas introduced into the first group and the second group are maintained constant in accordance with the elapsed deposition time T. In other words, the flow rates of the source gas introduced into the process chamber G1, process chamber G3 and process chamber G5 are constantly maintained to values α1, α2 and α3 respectively. The flow rates of the source gas introduced into the process chamber G2, process chamber G4 and process chamber G6 are constantly maintained to values β1, β2 and β3 respectively.

The first flow rate value of the source gas introduced into the process chambers G1, G3 and G5 of the first group increases as the substrate 100 passes by the process chamber G1, process chamber G3 and process chamber G5 of the first group. That is, when the substrate 100 is transferred within the process chamber G1, the source gas with the first flow rate value α1 is introduced into the process chamber G1. When the substrate 100 is transferred within the process chamber G3, the source gas with the first flow rate value α2 is introduced into the process chamber G3. Also, when the substrate 100 is transferred within the process chamber G5, the source gas with the first flow rate value α3 is introduced into the process chamber G5.

Similarly, the second flow rate value of the source gas introduced into the process chambers G2, G4 and G6 of the second group increases as the substrate 100 passes by the process chamber G2, process chamber G4 and process chamber G6 of the second group. That is, when the substrate 100 is transferred within the process chamber G2, the source gas with the second flow rate value β1 is introduced into the process chamber G2. When the substrate 100 is transferred within the process chamber G4, the source gas with the second flow rate value β2 is introduced into the process chamber G4. Also, when the substrate 100 is transferred within the process chamber G6, the source gas with the second flow rate value β3 is introduced into the process chamber G6.

FIG. 5 shows that the first flow rate value α and the second flow rate value β increase as the substrate 100 passes by the process chamber. However, the first flow rate value α may be maintained constant while the substrate 100 passes by the process chambers G1, G3 and G5 of the first group, and the second flow rate value β may increase when the substrate 100 passes by the process chambers G2, G4 and G6 of the second group. Further, the second flow rate value β may be maintained constant while the substrate 100 passes by the process chambers G2, G4 and G6 of the second group, and the first flow rate value α may increase when the substrate 100 passes by the process chambers G1, G3 and G5 of the first group.

Figure 6:
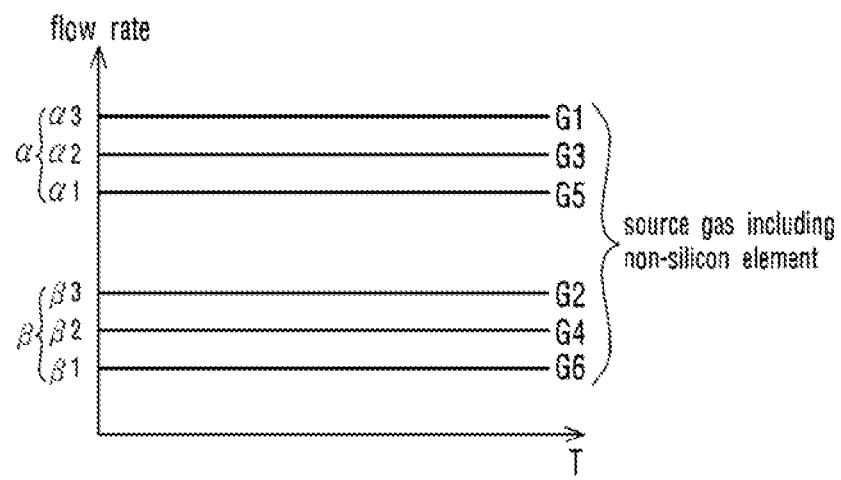

Unlike the flow rate changes of FIGS. 4 and 5, as shown in FIG. 6, the first flow rate value α and the second flow rate value β may decrease as the substrate 100 is transferred. That is, the first flow rate values α1, α2 and α3 and the second flow rate values β1, β2 and β3 of the source gas introduced into the process chambers G1, G3 and G5 of the first group and the process chambers G2, G4 and G6 of the second group are maintained constant in accordance with the elapsed deposition time T. In other words, the flow rates of the source gas introduced into the process chamber G1, process chamber G3 and process chamber G5 are constantly maintained to values α3, α2 and α1 respectively. The flow rates of the source gas introduced into the process chamber G2, process chamber G4 and process chamber G6 are constantly maintained to values β3, β2 and β1 respectively.

The first flow rate value of the source gas introduced into the process chambers G1, G3 and G5 of the first group decreases as the substrate 100 passes by the process chamber G1, process chamber G3 and process chamber G5 of the first group. That is, when the substrate 100 is transferred within the process chamber G1, the source gas with the first flow rate value α3 is introduced into the process chamber G1. When the substrate 100 is transferred within the process chamber G3, the source gas with the first flow rate value α2 is introduced into the process chamber G3. Also, when the substrate 100 is transferred within the process chamber G5, the source gas with the first flow rate value α1 is introduced into the process chamber G5.

Similarly, the second flow rate value of the source gas introduced into the process chambers G2, G4 and G6 of the second group decreases as the substrate 100 passes by the process chamber G2, process chamber G4 and process chamber G6 of the second group. That is, when the substrate 100 is transferred within the process chamber G2, the source gas with the second flow rate value β3 is introduced into the process chamber G2. When the substrate 100 is transferred within the process chamber G4, the source gas with the second flow rate value β2 is introduced into the process chamber G4. Also, when the substrate 100 is transferred within the process chamber G6, the source gas with the second flow rate value β1 is introduced into the process chamber G6.

FIG. 6 shows that the first flow rate value α and the second flow rate value β decrease as the substrate 100 passes by the process chamber. However, the first flow rate value α may be maintained constant while the substrate 100 passes by the process chambers G1, G3 and G5 of the first group, and the second flow rate value β may decrease when the substrate 100 passes by the process chambers G2, G4 and G6 of the second group. Further, the second flow rate value β may be maintained constant while the substrate 100 passes by the process chambers G2, G4 and G6 of the second group, and the first flow rate value α may decrease when the substrate 100 passes by the process chambers G1, G3 and G5 of the first group.

The flow rate change of FIG. 5 can be used to form the intermediate reflector 130 of a p-i-n type photovoltaic device. The flow rate change of FIG. 6 can be used to form the intermediate reflector 130 of an n-i-p type photovoltaic device.

The first unit cell 120 of the p-i-n type photovoltaic device includes a p-type semiconductor layer, an intrinsic semiconductor layer and an n-type semiconductor layer, all of which are sequentially stacked on the first electrode 100. The second unit cell 140 includes a p-type semiconductor layer, an intrinsic semiconductor layer and an n-type semiconductor layer, all of which are sequentially stacked on the intermediate reflector 130. In the p-i-n type photovoltaic device, light is incident on the first unit cell 120.

The first unit cell 120 of the n-i-p type photovoltaic device includes an n-type semiconductor layer, an intrinsic semiconductor layer and a p-type semiconductor layer, all of which are sequentially stacked on the first electrode 100. The second unit cell 140 includes an n-type semiconductor layer, an intrinsic semiconductor layer and a p-type semiconductor layer, all of which are sequentially stacked on the intermediate reflector 130. In the n-i-p type photovoltaic device, light is incident on the second unit cell 140.

In the p-i-n type photovoltaic device, as shown in FIG. 5, the first flow rate value α and the second flow rate value β increase as the substrate 100 is transferred. Accordingly, when a plurality of first sub-layers 130a and second sub-layers 130b are formed, with respect to any two first sub-layers of the first sub-layers 130a, the amount of the non-silicon element contained in one first sub-layer formed prior to the other first sub-layer is less than that contained in the other first sub-layer. The second sub-layers 130b are the same as the described first sub-layers 130a.

In the n-i-p type photovoltaic device, as shown in FIG. 6, the first flow rate value α and the second flow rate value β decrease as the substrate 100 is transferred. Accordingly, when a plurality of first sub-layers 130a and second sub-layers 130b are formed, with respect to any two first sub-layers of the first sub-layers 130a, the amount of the non-silicon element contained in one first sub-layer formed prior to the other first sub-layer is larger than that contained in the other first sub-layer. The second sub-layers 130b are the same as the described first sub-layers 130a.

That is, it is profiled such that the concentrations of the non-silicon element such as oxygen, carbon or nitrogen contained in the first sub-layer 130a and second sub-layer 130b respectively increases more the farther it is from a light incident side. For example, in the p-i-n type photovoltaic device, the concentration of the non-silicon element of the first sub-layers 130a or the second sub-layers 130b is increased more the farther it is from the first unit cell 120. In the n-i-p type photovoltaic device, the concentration of the non-silicon element of the first sub-layers 130a or the second sub-layers 130b is increased more the farther it is from the second unit cell 140.

When the concentration of the non-silicon element contained in the first sub-layers 130a or the second sub-layers 130b is increased more the farther it is from the light incident side, a refractive index at an interface between the intermediate reflector 130 and the unit cell on which light is incident is gradually changed, so that the amount of the reflected light is increased.

Unlike the embodiment of the present invention, when the flow rate of the source gas introduced into the process chamber is changed, powder may be produced and film quality of the first sub-layer 130a or the second sub-layer 130b can be degraded. On the other hand, in the embodiment of the present invention, the flow rate of the source gas introduced into each of the process chambers G1, G2, G3, G4, G5 and G6 is maintained constant, and thereby powder production can be prevented within the process chamber and the first sub-layer 130a or the second sub-layer 130b with improve film quality can be formed.

FIGS. 4 to 6 do not show a flow rate change of impurity. However, in the embodiment of the present invention, the flow rates of impurity introduced into the process chambers G1, G2, G3, G4, G5 and G6 may be the same as each other. Moreover, in the embodiment of the present invention, the flow rates of hydrogen introduced into the process chambers G1, G2, G3, G4, G5 and G6 may also be the same as each other, and the same is true for silane.

Meanwhile, the first sub-layer 130a and the second sub-layer 130b of the photovoltaic device according to the embodiment of the present invention can be formed according to the flow rate changes of the source gas including non-silicon element, or can be formed according to the frequency change of the voltage supplied by the process chamber power source E.

That is, a voltage with a first frequency f1 is supplied to one of the first group consisting of odd numbered process chambers G1, G3 and G5 and the second group consisting of even numbered process chambers G2, G4 and G6, so that the first sub-layer 130a including impurity is formed. In addition, a voltage with a second frequency f2 greater than the first frequency f1 is supplied to the other of the first group and the second group, so that the second sub-layer 130b including impurity is formed.

Figure 7:
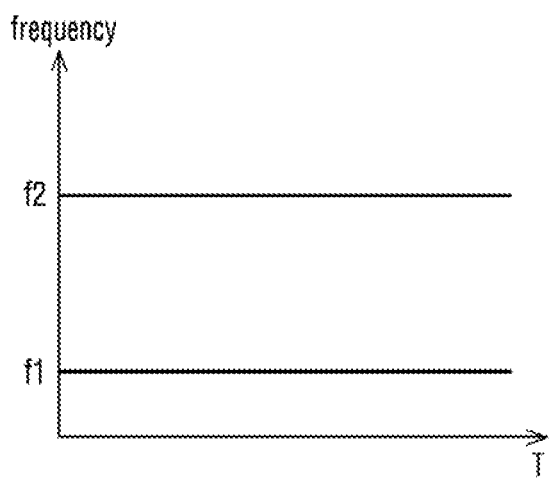
FIG. 7 shows a frequency of a voltage supplied to a first group and a second group in order to form an intermediate reflector in accordance with the embodiment of the present invention.

FIG. 7 shows a frequency of a voltage supplied to the first group and the second group in order to form the intermediate reflector 130 in accordance with the embodiment of the present invention. As shown, when the first sub-layer 130a and the second sub-layer 130b are formed according to the frequency of the voltage, process conditions (a flow rate of hydrogen, a flow rate of silane, a flow rate of impurity, temperature, pressure) within the process chambers G1 to G6 can be maintained constant for a time during which the first sub-layer 130a or the second sub-layer 130b is formed.

The higher the frequency of the voltage supplied to the process chamber is, the easier the crystallization becomes. Therefore, the crystal volume fraction of the second sub-layer 130b formed in the process chamber to which the voltage with the second frequency f2 greater than the first frequency f1 is supplied is greater than that of the first sub-layer 130a formed in the process chamber to which the voltage with the first frequency f1 is supplied. In the embodiment of the present invention, the first frequency f1 may be in the range of radio frequency (RF) and the second frequency f2 may be in the range of very high frequency (VHF).

With regard to the nano-crystalline silicon based material, the crystal volume fraction can be obtained through the following equation using an area of a component peak obtained by Raman spectroscopy.

$$\text{crystal volume fraction (\%)} = [(A_{510} + A_{520})/(A_{480} + A_{510} + A_{520})] * 100,$$

Here, $A_i$ represents an area of a component peak in the vicinity of i cm$^{-1}$.

As the crystal volume fraction becomes less due to either the increase of the flow rate of the source gas including non-silicon element or the reduction of the frequency of the voltage, the refractive index of the sub-layer is reduced as well. Accordingly, the refractive index of the first sub-layer 130a having a crystal volume fraction less than that of the second sub-layer 130b is less than the refractive index of the second sub-layer 130b.

As such, when the sub-layers 130a and 130b having mutually different crystal volume fractions or mutually different refractive indices are alternately stacked, each of the sub-layers 130a and 130b functions as a waveguide. Thereby, reflection of light with a particular wavelength, which is absorbed by a unit cell on which light is first incident among the plurality of the unit cells, can be selectively maximized by the intermediate reflector 130.

Here, the second sub-layer 130b having a relative large crystal volume fraction improves a vertical electrical conductivity, thereby making it possible to allow electric current to easily flow between the first unit cell 120 and the second unit cell 140. The refractive index of the first sub-layer 130a is less than that of the second sub-layer 130b and is matched to the refractive index of the light incident unit cell. Thereby the reflection of light with a short wavelength having a high energy density, for example, light with a wavelength from 500 nm to 700 nm can be increased.

Meanwhile, in the embodiment of the present invention, since the flow rates of the hydrogen and silane introduced into the process chambers G1 to G6 are maintained constant, a hydrogen dilution ratio, i.e., a ratio of the flow rate of the hydrogen to the flow rate of the silane can be maintained constant. In other words, the hydrogen dilution ratios within the process chambers G1 to G6 are the same as each other.

In the embodiment of the present invention, the first sub-layer 130a and the second sub-layer 130b are formed according to the flow rate change of the source gas introduced into the process chambers of the first group and the process chambers of the second group or according to the frequency change of the voltage supplied to the process chambers of the first group and the process chambers of the second group. Accordingly, although the hydrogen dilution ratios within the process chambers G1 to G6 are the same as each other, the first sub-layer 130a and the second sub-layer 130b can be formed. The flow rates of the hydrogen and silane are greater than that of the source gas including non-silicon element. Therefore, when the flow rates of the hydrogen and silane are maintained constant, it is possible to prevent turbulence from being generated within the process chambers G1, G2, G3, G4, G5 and G6 due to the flow rate changes of the hydrogen and silane.

In the embodiment of the present invention, the total thickness of the intermediate reflector 130 is equal to or larger than 20 nm and equal to or less than 120 nm. When the total thickness of the intermediate reflector 130 is equal to or larger than 20 nm, the refractive index of the light incident unit cell is matched to the refractive index of the intermediate reflector 130, so that internal reflection can easily occur. When the total thickness of the intermediate reflector 130 is equal to or less than 120 nm, it is possible to prevent excessive light absorption by the intermediate reflector 130 itself due to the thickness increase of the intermediate reflector 130. When the thickness of the intermediate reflector 130 is excessively increased, the number of the process chambers is increased. Therefore, when the total thickness of the intermediate reflector 130 is equal to or less than 120 nm, it is possible to prevent the number of the process chambers from being excessively increased.

The thickness of each of the first sub-layer 130a and the second sub-layer 130b is equal to or larger than 10 nm and equal to or less than 50 nm. When the thickness of the first sub-layer 130a and the second sub-layer 130b are equal to or larger than 10 nm, refractive index matching is accomplished and sufficient crystalline silicon grains are formed. When the thickness of either the first sub-layer 130a or the second sub-layer 130b is larger than 50 nm, the sub-layer becomes so thick that the number of sub-layers included in the intermediate reflector 130 is reduced. As a result, internal reflection by the intermediate reflector 130 might be reduced. Therefore, when the thickness of the first sub-layer 130a and the second sub-layer 130b is equal to or less than 50 nm, the intermediate reflector 130 includes an appropriate number of sub-layers, so that light can be easily reflected.

Meanwhile, the refractive index of the intermediate reflector 130 including the first sub-layer 130a and the second sub-layer 130b is equal to or greater than 1.7 and equal to or less than 2.5 at a wavelength of 600 nm. When the refractive index of the intermediate reflector 130 is equal to or greater than 1.7, conductivity thereof increases, a fill factor (FF) of a multi junction photovoltaic device is improved and efficiency is increased. When the refractive index of the intermediate reflector 130 is equal to or less than 2.5, light with a wavelength range from 500 nm to 700 nm is easily reflected and the short circuit current of the first unit cell increases. As a result, the efficiency is enhanced.

An average content of the non-silicon element contained in the intermediate reflector 130 is equal to or more than 10 atomic % and equal to or less than 40 atomic %. When the average content of the non-silicon element is equal to or more than 10 atomic %, the refractive index of the light incident unit cell is matched to the refractive index of the intermediate reflector 130, so that internal reflection can easily occur.

When the average content of the non-silicon element is unnecessarily large, the crystal volume fractions of the sub-layers are reduced and the vertical electrical conductivity thereof may decrease. Accordingly, in the embodiment of the present invention, when the average content of the non-silicon element is equal to or less than 40 atomic %, the average crystal volume fraction of the intermediate reflector 130 is appropriately maintained, and it prevents the intermediate reflector 130 from getting amophous amorphized and electrical conductivity is enhanced.

The average hydrogen content of the intermediate reflector 130 is equal to or more than 10 atomic % and equal to or less than 25 atomic %. When the average hydrogen content of the intermediate reflector 130 is equal to or more than 10 atomic %, the film quality of the intermediate reflector 130 is improved since the dangling bonds are passivated. When the average hydrogen content of the intermediate reflector 130 is unnecessarily large, the electrical conductivity is degraded since the crystal volume fraction of the intermediate reflector 130 is reduced. Accordingly, when the average hydrogen content of the intermediate reflector 130 is equal to or less than 25 atomic %, the vertical electrical conductivity is increased since it prevents the intermediate reflector 130 from getting amorphous caused by the decrease of the crystal volume fraction.

The crystal volume fraction of the intermediate reflector 130 is equal to or greater than 4% and equal to or less than 30%. When the crystal volume fraction of the intermediate reflector 130 is equal to or greater than 4%, tunnel junction property can be improved. When the crystal volume fraction of the intermediate reflector 130 is equal to or less than 30%, the refractive index matching characteristics can be prevented from being degraded since the non-silicon material content is maintained.

Meanwhile, when the intermediate reflector 130 according to the embodiment of the present invention is composed of the n-type nano-crystalline silicon based material having an excellent vertical electrical conductivity, the intermediate reflector 130 can replace the n-type semiconductor layer of the light incident unit cell.

For example, when the first unit cell 120 includes the p-type semiconductor layer, the intrinsic semiconductor layer and the intermediate reflector 130 composed of the n-type nano-crystalline silicon based material, all of which are sequentially stacked on the substrate 100, and when the second unit cell 140 includes the p-type semiconductor layer, the intrinsic semiconductor layer and the n-type semiconductor layer, all of which are sequentially stacked on the intermediate reflector 130, the intermediate reflector 130 can function as the n-type semiconductor layer of the first unit cell 120 on which light is incident.

Moreover, when the first unit cell 120 includes the n-type semiconductor layer, the intrinsic semiconductor layer and the p-type semiconductor layer, all of which are sequentially stacked on the substrate 100, and when the second unit cell 140 includes the intermediate reflector 130 composed of the n-type nano-crystalline silicon based material, the intrinsic semiconductor layer and the p-type semiconductor layer, all of which are sequentially stacked on the first unit cell 120, the intermediate reflector 130 can function as the n-type semiconductor layer of the second unit cell 140 on which light is incident.

Accordingly, when the intermediate reflector 130 is composed of the n-type nano-crystalline silicon based material, a unit cell on which light is first incident among both the first unit cell 120 and the second unit cell 140 includes the p-type semiconductor layer and the intrinsic semiconductor layer, and the intermediate reflector 130 is able to contact with the intrinsic semiconductor layer.

As described above, as the substrate is transferred, either the flow rate of the source gas introduced into the process chamber or the frequency of the voltage supplied to the process chamber are changed, so that the first sub-layer 130a and the second sub-layer 130 are formed. Moreover, although the process condition of each of the process chambers is maintained constant, the first sub-layer 130a and the second sub-layer 130 can be formed. Therefore, film uniformity of the first sub-layer 130a and the second sub-layer 130 can be improved.

For example, when the first sub-layer 130a is formed in the process chamber G1 and the second sub-layer 130b is formed in the process chamber G2, the process condition within the process chamber G1 is maintained constant for a time during which the first sub-layer 130a is formed, and the process condition within the process chamber G2 is maintained constant for a time during which the second sub-layer 130b is formed.

Unlike the foregoing description, the first sub-layer 130a and the second sub-layer 130 may be formed by simultaneously changing the frequency and the flow rate of the impurity.

That is, the first flow rate values α of the source gas introduced into one of the first group consisting of odd numbered process chambers G1, G3 and G5 and the second group consisting of even numbered process chambers G2, G4 and G6 is maintained constant, so that the first sub-layer 130a including impurity is formed. The second flow rate values β of the source gas introduced into the other of the first group and the second group are less than the first flow rate values α and is maintained constant in each of the process chambers of the other group, so that the second sub-layer 130b including impurity is formed.

The concentration of the non-silicon element contained in the first sub-layers 130a or the second sub-layers 130b may be increased more the farther it is from the light incident side. Here, in the first group and the second group, the first frequency f1 of the voltage supplied to the process chambers of one group in which the first sub-layer 130a is formed is less than the second frequency f2 of the voltage supplied to the process chambers of the group in which the second sub-layer 130b is formed.

As such, the first sub-layer 130a and the second sub-layer 130 may be formed according to the concentration change of the non-silicon element and the frequency change.

While the embodiment of the present invention has been described with reference to the accompanying drawings, it can be understood by those skilled in the art that the present invention can be embodied in other specific forms without departing from its spirit or essential characteristics. Therefore, the foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for manufacturing a photovoltaic device by forming an intermediate reflector including a first sub-layer and a second sub-layer through the introduction of source gas including non-silicon element into a plurality of process chambers, the method comprising:

a forming the first sub-layer including impurity by allowing first flow rate values of the source gas introduced into one group of a first group consisting of odd numbered process chambers and a second group consisting of even numbered process chambers to be maintained constant in each of the process chambers of the one group; and a forming the second sub-layer including impurity by allowing second flow rate values of the source gas introduced into the other group of the first group and the second group to be maintained constant in each of the process chambers of the other group, wherein the second flow rate values are less than the first flow rate values.

2. The method of claim 1, wherein process conditions within the process chambers of the first and the second groups are maintained constant for a time during which the first sub-layer or the second sub-layer is formed.

3. The method of claim 1, wherein the intermediate reflector comprises a hydrogenated nano-crystalline silicon based material.

4. The method of claim 1, wherein a concentration of the non-silicon element contained in the first sub-layer or the second sub-layer is increased more the farther it is from a light incident side.

5. The method of claim 1, wherein a refractive index of the intermediate reflector is equal to or greater than 1.7 and equal to or less than 2.5 at a wavelength of 600 nm.

6. The method of claim 1, wherein, when the intermediate reflector is composed of an n-type nano-crystalline silicon based material, a unit cell closer to a light incident side between a first unit cell and a second unit cell includes a p-type semiconductor layer and an intrinsic semiconductor layer, and the intermediate reflector contacts with the intrinsic semiconductor layer.

7. The method of claim 1, wherein an average content of the non-silicon element of the intermediate reflector is equal to or more than 10 atomic % and equal to or less than 40 atomic %.

8. The method of claim 1, wherein, when the intermediate reflector is composed of an n-type nano-crystalline silicon based material, an intrinsic semiconductor layer of a unit cell closer to a light incident side between a first unit cell and a second unit cell contacts with the intermediate reflector.

9. The method of claim 1, wherein a total thickness of the intermediate reflector is equal to or larger than 20 nm and equal to or less than 120 nm.

10. The method of claim 1, wherein, when either a second conductive semiconductor layer of a first unit cell which receives light prior to a second unit cell or a first conductive semiconductor layer of the second unit cell which receives light prior to the first unit cell is composed of an n-type nano-crystalline silicon, a thickness of the n-type nano-crystalline silicon is equal to or larger than 5 nm and equal to or less than 30 nm.

11. A method for manufacturing a photovoltaic device by forming an intermediate reflector including a first sub-layer and a second sub-layer through the introduction of source gas including non-silicon element into a plurality of process chambers, the method comprising:

a forming the first sub-layer including impurity by supplying voltage with a first frequency to one group of a first group consisting of odd numbered process chambers and a second group consisting of even numbered process chambers; and a forming the second sub-layer including impurity by supplying voltage with a second frequency greater than the first frequency to the other group of the first group and the second group.

12. The method of claim 11, wherein process conditions within the process chambers of the first and the second groups are maintained constant for a time during which the first sub-layer or the second sub-layer is formed.

13. The method of claim 11, wherein the intermediate reflector comprises a hydrogenated nano-crystalline silicon based material.

14. The method of claim 11, wherein a concentration of the non-silicon element contained in the first sub-layer or the second sub-layer is increased more the farther it is from a light incident side.

15. The method of claim 11, wherein a refractive index of the intermediate reflector is equal to or greater than 1.7 and equal to or less than 2.5 at a wavelength of 600 nm.

16. The method of claim 11, wherein, when the intermediate reflector is composed of an n-type nano-crystalline silicon based material, a unit cell closer to a light incident side between a first unit cell and a second unit cell includes a p-type semiconductor layer and an intrinsic semiconductor layer, and the intermediate reflector contacts with the intrinsic semiconductor layer.

17. The method of claim 11, wherein an average content of the non-silicon element of the intermediate reflector is equal to or more than 10 atomic % and equal to or less than 40 atomic %.

18. The method of claim 1, wherein, when the intermediate reflector is composed of an n-type nano-crystalline silicon based material, an intrinsic semiconductor layer of a unit cell closer to a light incident side between a first unit cell and a second unit cell contacts with the intermediate reflector.

19. The method of claim 11, wherein a total thickness of the intermediate reflector is equal to or larger than 20 nm and equal to or less than 120 nm.

20. The method of claim 11, wherein, when either a second conductive semiconductor layer of a first unit cell which receives light prior to a second unit cell or a first conductive semiconductor layer of the second unit cell which receives light prior to the first unit cell is composed of an n-type nano-crystalline silicon, a thickness of the n-type nano-crystalline silicon is equal to or larger than 5 nm and equal to or less than 30 nm.

* * * * *